(12) United States Patent
Yamamoto et al.

(10) Patent No.: US 7,943,475 B2
(45) Date of Patent: May 17, 2011

(54) PROCESS FOR MANUFACTURING A SEMICONDUCTOR DEVICE COMPRISING A METAL-COMPOUND FILM

(75) Inventors: Tomoe Yamamoto, Kanagawa (JP);
Toshihiro Iizuka, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 412 days.

(21) Appl. No.: 11/324,536

(22) Filed: Jan. 4, 2006

(65) Prior Publication Data

US 2006/0121671 A1 Jun. 8, 2006

Related U.S. Application Data

(62) Division of application No. 10/807,248, filed on Mar. 24, 2004, now abandoned.

(30) Foreign Application Priority Data

Mar. 26, 2003 (JP) .................. 2003-084314

(51) Int. Cl.
*H01L 27/108* (2006.01)
*H01L 21/8242* (2006.01)

(52) U.S. Cl. ........ 438/396; 438/785; 257/310; 257/906; 257/E21.649

(58) Field of Classification Search .............. 257/68–71, 257/296–309, 905–908, E27.084–E27.097, 257/E27.075, E21.646–E21.66; 438/239–240, 438/243, 253, 381, 386–387, 396, 393, 763, 438/785

See application file for complete search history.

(56) References Cited

U.S. PATENT DOCUMENTS

| 6,627,034 B1* | 9/2003 | Ufer et al. ..................... 156/289 |
| 6,875,667 B2* | 4/2005 | Iizuka et al. .................. 438/381 |
| 6,877,144 B1* | 4/2005 | Rittman et al. ................. 716/10 |
| 7,087,495 B2* | 8/2006 | Kawahara et al. ............ 438/287 |
| 7,259,058 B2* | 8/2007 | Shimamoto et al. .......... 438/240 |
| 7,276,444 B2* | 10/2007 | Yamamoto .................... 438/681 |
| 7,425,493 B2* | 9/2008 | Yoon et al. .................... 438/396 |
| 7,439,181 B2* | 10/2008 | Yamamoto .................... 438/681 |
| 2002/0102826 A1* | 8/2002 | Shimamoto et al. .......... 438/575 |
| 2002/0187644 A1* | 12/2002 | Baum et al. ................... 438/700 |
| 2002/0190294 A1* | 12/2002 | Iizuka et al. .................. 257/296 |
| 2003/0073324 A1* | 4/2003 | Matijasevic et al. ......... 438/763 |

(Continued)

FOREIGN PATENT DOCUMENTS

JP 2001-196368 7/2001

(Continued)

OTHER PUBLICATIONS

H. Berndt, A.-Q. Zeng, H.-R. Stock, P. Mayr, "Zirconium carbonitride films produced by plasma-assisted metal organic chemical vapour deposition," Elsevier, Surface and Coatings Technology 74-75 (1995) 369-374.*

(Continued)

*Primary Examiner* — Laura M Menz
*Assistant Examiner* — Maliheh Malek
(74) *Attorney, Agent, or Firm* — Young & Thompson

(57) ABSTRACT

There is provided a semiconductor device comprising a dielectric film made of a high dielectric constant material, in which a leak current is reduced in the film and which exhibits improved device reliability. Specifically, a dielectric film 142 is a metal-compound film having a composition represented by the formula $MO_xC_yN_z$ wherein x, y and z meet the conditions: $0<x$, $0.1 \leq y \leq 1.25$, $0.01 \leq z$ and $x+y+z=2$; and M comprises at least Hf or Zr.

12 Claims, 14 Drawing Sheets

U.S. PATENT DOCUMENTS

| | | | |
|---|---|---|---|
| 2003/0104661 A1* | 6/2003 | Koyama | 438/164 |
| 2005/0037630 A1* | 2/2005 | Doh et al. | 438/785 |
| 2005/0170601 A1* | 8/2005 | Yoon et al. | 438/396 |
| 2005/0268851 A1* | 12/2005 | Yamamoto | 118/723 IR |
| 2005/0268853 A1* | 12/2005 | Yamamoto et al. | 118/726 |
| 2007/0117331 A1* | 5/2007 | Khamankar et al. | 438/287 |
| 2010/0003832 A1* | 1/2010 | Yamamoto et al. | 438/758 |

FOREIGN PATENT DOCUMENTS

| | | | | |
|---|---|---|---|---|
| JP | 2001121312 | * | 8/2001 | |
| JP | 2002-343790 | | 11/2002 | |
| JP | 2002-373945 | | 12/2002 | |
| JP | 2003-055093 | | 2/2003 | |
| JP | 2003-060198 | | 2/2003 | |
| JP | 2003-086769 | | 3/2003 | |
| JP | 2003-303820 | | 10/2003 | |
| JP | 2004-104025 | | 4/2004 | |
| JP | 2004-104111 | | 4/2004 | |
| JP | 2004-165668 | | 6/2004 | |
| KR | 2002-0048720 | * | 8/2002 | 438/396 |
| WO | 02/079211 | | 10/2002 | |

OTHER PUBLICATIONS

Berndt et al., Zirconium carbonitride films produced by plasma-assisted metal organic chemical vapour deposition, Elsevier: Surface and Coatings Technology 74-75 (1995) 369-374.*

Japanese Patent Office issued a Japanese Office Action dated Jan. 5, 2010, Application No. 2003-084314.

Japanese Patent Office issued a Japanese Office Action date Apr. 20, 2010, Application No. 2003-084314.

* cited by examiner

PRIOR ART

PROCESS FOR MANUFACTURING A SEMICONDUCTOR DEVICE COMPRISING A METAL-COMPOUND FILM

This application is a division of co-pending application Ser. No. 10/807,248, filed on Mar. 24, 2004, the entire contents of which are hereby incorporated by reference.

FIELD OF THE INVENTION

This invention relates to a semiconductor device comprising a metal-compound film on a semiconductor substrate and a manufacturing process therefore.

BACKGROUND OF THE INVENTION

A high dielectric constant (so-called "high-k") film has been recently investigated as a component in a semiconductor device. Representative examples of a high-k material include Zr- and Hf-containing oxides. Such a material can be used for a dielectric film in a capacitor or a gate insulating film in an MOSFET to achieve good device performance which has not been obtained by the prior art.

Japanese patent application NO. 2002-373945 discloses a capacitor comprising such a high-k material. Therein, a dielectric film made of the high-k material is formed by atomic layer deposition (ALD). The ALD process in which one-atomic layers are deposited one by one has advantages that a deposition process may be conducted at a lower temperature and that a film with good film properties may be obtained.

FIG. 2 shows a cross-sectional view of the capacitor described in Japanese patent application NO. 2002-373945. Therein, on a substrate 21 are formed a device separating region 22 while in a device region is formed a transistor consisting of a gate electrode 23 and a source/drain diffusion layer 24. On both sides of the gate electrode 23, there are formed side walls 25. An unshown cobalt silicide film covers over the gate electrode 23 and the source/drain diffusion layer 24.

On the transistor is formed a bit line 29 via a cell contact 28. On the transistor is formed a cylindrical MIM capacitor via a capacitor contact 31. The capacitor has a structure that there are laminated a lower electrode 34, a dielectric film 35 and an upper electrode 36 are deposited, on which a tungsten film 37 is formed. An insulating film for the dielectric film 35 is made of a metal material such as $ZrO_2$. The dielectric film 35 is deposited by atomic layer deposition.

When forming a $ZrO_2$ film by atomic layer deposition, deposition gas used generally comprises $ZrCl_4$ and $H_2O$. The above reference has also described that a $ZrO_2$ layer can be formed by the method. There have been, however, increased needs for a high-k film with much higher film properties and for a deposition process with a higher production efficiency. Any deposition process according to the prior art cannot adequately meet the needs. Furthermore, it has been strongly needed that a leak current is reduced in a capacitor comprising a high-k material.

Furthermore, there have been attempts to use a high-k material for a gate insulating film in a transistor. Using such a material, a film can be thin as calculated as a silicon oxide film even when making a gate insulating film thicker to some extent, so that a physically and structurally stable gate insulating film can be achieved. However, in a transistor comprising such a gate insulating film, dopants introduced in a gate electrode may sometimes penetrate the gate insulating film to reach a channel region. Dopant penetration may significantly deteriorate reliability of a semiconductor device without transistor properties as designed. In designing a transistor comprising a high-k gate insulating film, adequately preventing such dopant penetration is an important technical problem.

In view of the above situation, an objective of this invention is to give a semiconductor device comprising a film made of a high dielectric constant material with a reduced leak current in the film and with improved device reliability.

Another objective of this invention is to provide a capacitor with a higher capacity and a reduced leak current.

A further objective of this invention is to provide a transistor comprising a gate insulating film with a smaller thickness as calculated as a silicon oxide film and with improved reliability.

SUMMARY OF THE INVENTION

This invention provides a semiconductor device comprising a semiconductor substrate and a metal-compound film thereon, wherein the metal-compound film has a composition represented by the formula:

$$MO_xC_yN_z$$

wherein x, y and z meet the conditions: $0<x$, $0.1 \leq y \leq 1.25$, $0.01 \leq z$ and $x+y+z=2$; and M comprises at least Hf or Zr.

This invention also provides a semiconductor device comprising a semiconductor substrate, a pair of electrodes thereon and a capacitor comprising a dielectric film between the electrodes, wherein the dielectric film comprises a metal-compound film having a composition represented by the formula:

$$MO_xC_yN_z$$

wherein x, y and z meet the conditions: $0<x$, $0.1 \leq y \leq 1.25$, $0.01 \leq z$ and $x+y+z=2$; and M comprises at least Hf or Zr.

The semiconductor device may further comprise a gate electrode formed on the semiconductor substrate; a transistor comprising a source and a drain regions formed in the semiconductor substrate whose surfaces are silicided; and a connecting plug for connecting the source and the drain regions in the transistor with the capacitor.

This invention also provides a semiconductor device comprising a semiconductor substrate; a gate insulating film formed on the main surface of the semiconductor substrate; a gate-electrode on the gate insulating film; and a source and a drain regions formed on the semiconductor substrate which together sandwich the gate electrode, wherein the gate insulating film comprises a metal-compound film having a composition represented by the formula:

$$MO_xC_yN_z$$

wherein x, y and z meet the conditions: $0<x$, $0.1 \leq y \leq 1.25$, $0.01 \leq z$ and $x+y+z=2$; and M comprises at least Hf or Zr.

This invention also provides a process for manufacturing a semiconductor device, comprising the step of forming a metal-compound film having a composition represented by the formula:

$$MO_xC_yN_z$$

wherein x, y and z meet the conditions: $0<x$, $0.1 \leq y \leq 1.25$, $0.01 \leq z$ and $x+y+z=2$; and M comprises at least Hf or Zr, on a semiconductor substrate by atomic layer deposition.

This invention also provides a process for manufacturing a semiconductor device comprising forming a first electrode, a dielectric film and a second electrode on a semiconductor substrate, wherein the step of forming the dielectric film comprises forming a metal-compound film having a composition represented by the formula:

$$MO_xC_yN_z$$

wherein x, y and z meet the conditions: 0<x, 0.1≦y≦1.25, 0.01≦z and x+y+z=2; and M comprises at least Hf or Zr, on a semiconductor substrate by atomic layer deposition.

The process for manufacturing a semiconductor device may further comprise the steps of forming a gate electrode on the semiconductor substrate; introducing a dopant into the main surface of the semiconductor substrate to form a source and a drain regions such that the gate electrode is sandwiched between the regions; siliciding the surfaces of the source and the drain regions; and forming an interlayer insulating film over the gate electrode, the source region and the drain region, then selectively removing the interlayer insulating film to form a contact hole reaching the source and the drain regions, and then filling the contact hole with a metal film to form a connecting plug, wherein the first electrode is formed such that the connecting plug is connected with the first electrode; the dielectric film is formed at 200° C. to 400° C. both inclusive; and the first and the second electrodes are formed at 500° C. or lower.

This invention also provides a process for manufacturing a semiconductor device comprising the steps of forming a gate insulating film on a semiconductor substrate; forming a gate electrode film on the gate insulating film; shaping the gate insulating film and the gate electrode film into a given shape to form a gate electrode; and introducing a dopant into the main surface of the semiconductor substrate to form a source and a drain regions such that the gate electrode is sandwiched between the regions, wherein the step of forming the gate insulating film comprises forming a metal-compound film having a composition represented by the formula:

$$MO_xC_yN_z$$

wherein x, y and z meet the conditions: 0<x, 0.1≦y≦1.25, 0.01≦z and x+y+z=2; and M comprises at least Hf or Zr, on a semiconductor substrate by atomic layer deposition.

A semiconductor device according to this invention comprises a metal-compound film represented by the above formula $MO_xC_yN_z$. The metal-compound film comprises carbon and nitrogen within a particular composition range, so that a leak current can be significantly reduced. By our study, it has been confirmed that flatness in a film surface can be improved by using a metal-compound film having the above particular composition. It would thus contribute to reduction in a leak current between the metal-compound film and the adjacent film. Although the reason why flatness in the surface of the metal-compound film is improved is not clearly understood, it would be speculated that a film composition in which carbon and nitrogen are contained within a particular range may lead to reduction in a size of grains constituting the film, resulting in improved flatness in the film surface.

Reduction in a leak current may be more significant when applying this invention to a capacitor. A capacitor has a configuration where a dielectric film made of a dielectric is disposed between a pair of metal electrodes, so that a leak current tends to generate in an interface between the different materials. According to this invention, surface flatness in a dielectric film comprising the above metal-compound film can be improved, so that a leak current in such an interface may be effectively reduced.

Furthermore, when applying this invention to a transistor, migration of dopants within a gate insulating film can be inhibited and dopant penetration described in "Description of the Prior Art" can be inhibited. Although the reason is not clearly understood, it would be speculated that a film composition containing carbon and nitrogen within a particular range may lead to reduction in a size of grains constituting the film, so that migration of the dopants via a grain boundary.

A process for manufacturing a semiconductor device according to this invention employing chemical vapor deposition, preferably atomic layer deposition may consistently provide a semiconductor device having the above good properties.

DETAILED DESCRIPTION OF THE INVENTION

Figure 1:
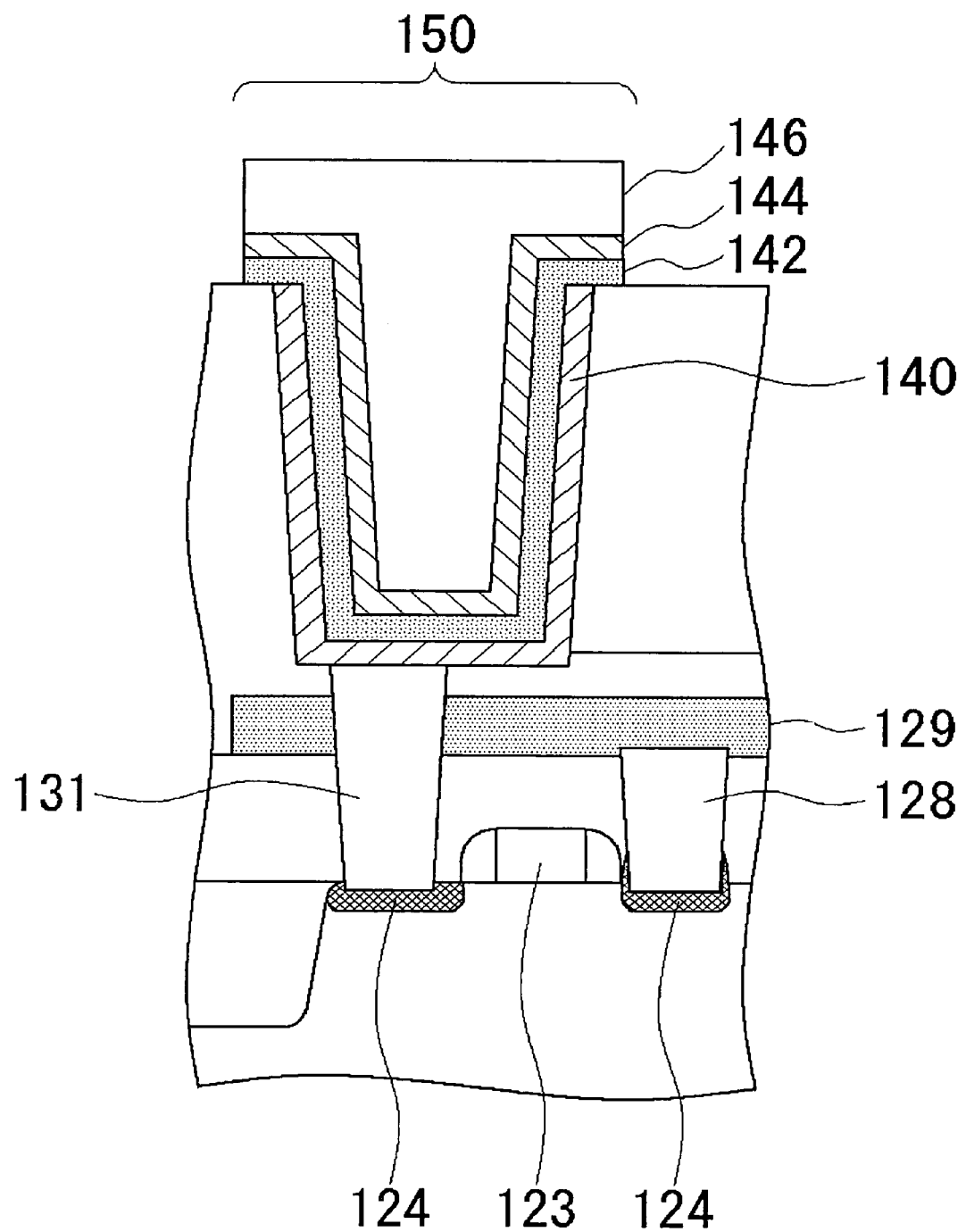
FIG. 1 shows a structure of a capacitor according to an embodiment.
Figure 2:
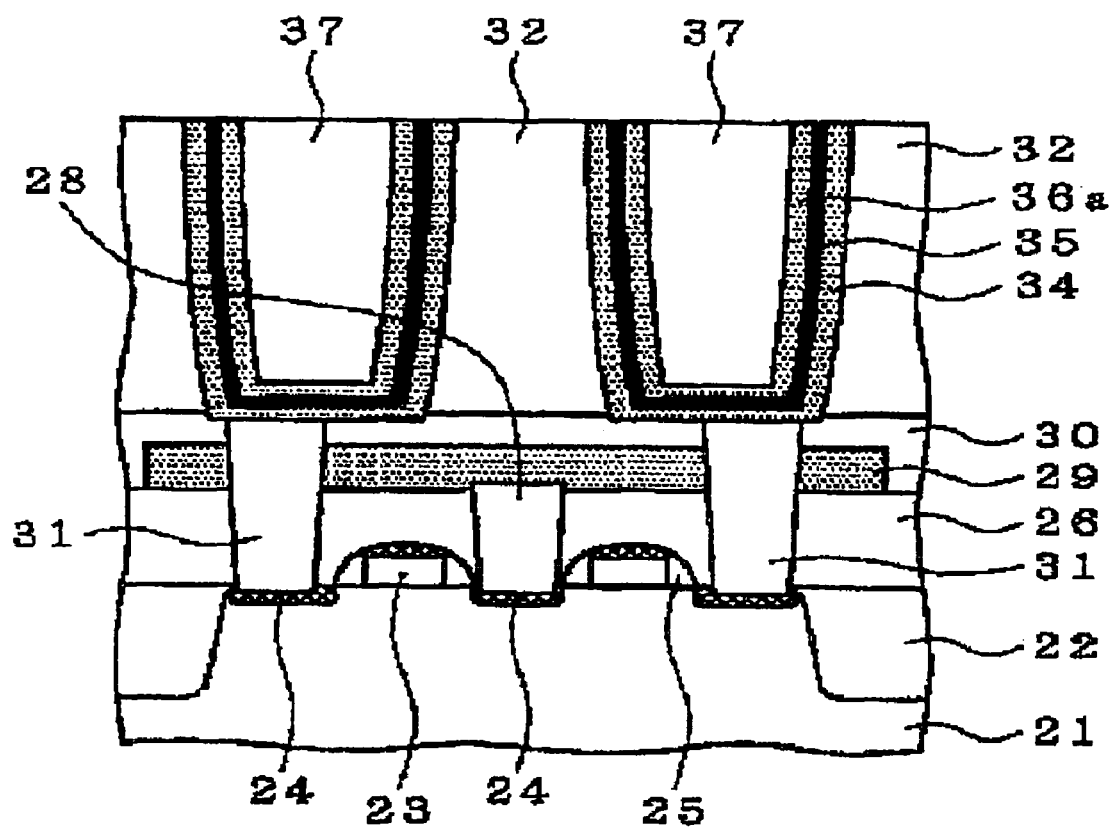
FIG. 2 shows a structure of a capacitor according to the prior art.

In this invention, the formula $MO_xC_yN_z$ may meet the conditions: 0.7≦x≦1.85 and 0.05≦z≦0.2 to more reliably reduce a leak current in the metal-compound film. Furthermore, 0.1 or less of z indicating a nitrogen ratio may increase a relative oxygen ratio to improve a dielectric constant. The metal-compound film defined by the above formula $MO_xC_yN_z$ may contain additional trace elements.

A semiconductor device of this invention may further comprise a gate electrode formed on a semiconductor substrate; a transistor comprising a source and a drain regions formed in the semiconductor substrate whose surfaces are silicided; and a connecting plug for connecting the source and the drain regions in the transistor with the capacitor. Siliciding the surfaces of the source and the drain regions may reduce a resistance in the source and the drain regions and reduce a contact resistance of the connecting plug with the source and the drain regions, resulting in higher-speed transistor operation.

When forming the metal-compound film by atomic layer deposition in this invention, the deposition gas may comprise:

$$M(NRR')_4$$

wherein M comprises at least Hf or Zr; and R and R' independently represent hydrocarbon, so that the metal-compound film having the above particular composition may be consistently provided and contamination with particles derived from the deposition gas may be inhibited, resulting in more improved metal-compound film properties.

In this invention, after forming the metal-compound film, the film may be annealed in nitrogen or a nitrogen-containing gas, to introduce nitrogen into the film. Such introduction of nitrogen into the metal-compound film can further reduce a leak current.

When applying this invention to a capacitor, the following configuration may be employed. The device may further comprise a gate electrode formed on a semiconductor substrate; a transistor comprising a source and a drain regions formed in the semiconductor substrate whose surfaces are silicided; and a connecting plug for connecting the source and the drain regions in the transistor with the capacitor. Siliciding the surfaces of the source and the drain regions may reduce a resistance in the source and the drain regions and reduce a contact resistance of the connecting plug with the source and the drain regions, resulting in higher-speed transistor operation. In such a silicided source or drain region, silicide aggregation may be caused in a process at an elevated temperature of, for example, 500° C. or higher. For the capacitor according to this invention, a dielectric film can be formed by a low-temperature deposition process at 200° C. to 400° C. such as atomic layer deposition, so that such aggregation can be prevented. A semiconductor device having such a configuration may be manufactured by the steps of forming a gate electrode on the semiconductor substrate; introducing a dopant into the main surface of the semiconductor substrate to form a source and a drain regions such that the gate electrode is sandwiched between the regions; siliciding the surfaces of the source and the drain regions; and forming an interlayer insulating film over the gate electrode, the source region and the drain region, then selectively removing the interlayer insulating film to form a contact hole reaching the source and the drain regions, and then filling the contact hole with a metal film to form a connecting plug. In the process, the first electrode is formed such that the connecting plug is connected with the first electrode. In addition, the first and the second electrodes are formed at 500° C. or lower. A lower limit for the temperature may be appropriately selected depending on a deposition method; for example, 100° C. or higher.

The step of siliciding the surfaces of the source and the drain regions may comprise forming a metal film made of a transition metal adjacent to the source and the drain regions and then heating the film. Examples of a transition-metal film may include cobalt and nickel films. When employing such a configuration, the step of forming the first electrode, the dielectric film and the second electrode in the capacitor must be conducted at 500° C. or lower. At a temperature higher than 500° C., silicide formed in the source and the drain regions may be aggregated, leading to an increased contact resistance of the connecting plug with the source and the drain regions. For forming an electrode and a dielectric film by a low-temperature process, it is preferable that an electrode material is properly selected and the dielectric film is deposited by atomic layer deposition. Given these conditions, preferable examples of an electrode material include materials containing Ti, W, Pt, Ir, Ru or a nitride thereof.

Preferred embodiments of this invention will be described with reference to the drawings.

Embodiment 1

This embodiment relates to a cylinder type MIM capacitor. FIG. 1 schematically shows a structure of the capacitor according to this embodiment, which a cylinder type MIM capacitor is formed, via a capacitor contact 131, on a transistor comprising a gate electrode 123 and a source-drain region 124. The capacitor has a structure in which a lower electrode (a first electrode) 140, a dielectric film 142, an upper electrode (a second electrode) 144 and a tungsten film are sequentially deposited and these are patterned. A bit line 129 is formed on the transistor via a cell contact 128. Although the bit line 129 and the capacitor contact 131 are drawn in the same cross-sectional view in FIG. 1, it is for the sake of deeper understanding of the whole structure, but actually these are not crossed. In this configuration, there is disposed a bit line 129 in a gap in the region where the capacitor contact 131 is disposed.

The dielectric film 142 is a metal-compound film having a composition represented by $ZrO_xC_yN_z$ wherein x, y and z meet the conditions: $0<x$, $0.1 \leq y \leq 1.25$, $0.01 \leq z$, $x+y+z=2$. A metal-compound film having such a composition cannot be obtained simply by selecting a deposition gas as appropriate, but can be obtained only by appropriately selecting a deposition gas and optimizing the deposition conditions.

Since a dielectric film is made of a metal compound having such a particular composition, a capacitor according to this embodiment has a high capacity while a leak current is significantly reduced. There will be described the process for manufacturing a device shown in FIG. 1.

Figure 3A:
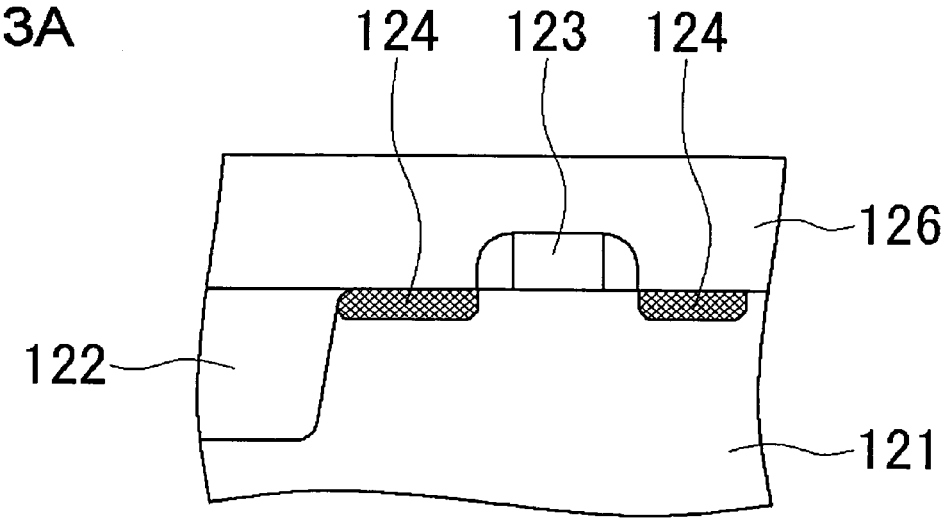
FIG. 3A and FIG. 3B illustrate a process for manufacturing a capacitor according to an embodiment.

First, a transistor is formed as shown in FIG. 3A. On a silicon substrate 121 are formed a device separating region 122 and then a gate electrode 123 via an unshown gate insulating film. Then, a dopant is ion-implanted around the surface of the substrate 121 to form a source-drain region 124. Then, on the surfaces of the gate electrode 123 and the source-drain region 124 is formed a cobalt film, which is heated to form a cobalt silicide film. On the transistor thus formed is formed an interlayer insulating film 126.

Figure 3B:
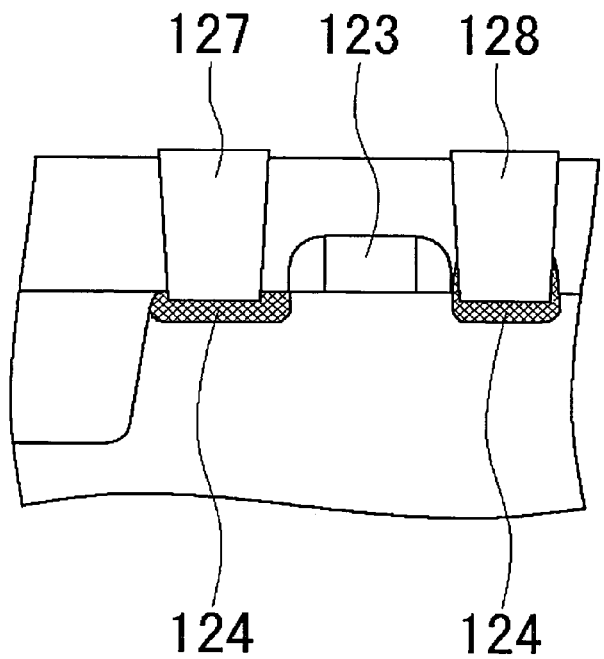

Next, the interlayer insulating film 126 is selectively dry-etched to form a contact hole reaching the source-drain region 124. Then, on the contact hole are formed TiN/Ti as a barrier film and then a tungsten film such that the hole is filled with the latter. The tungsten was then polished by CMP to form a tungsten plug. Thus, cell contacts 127, 128 are formed as shown in FIG. 3B.

Figure 4C:
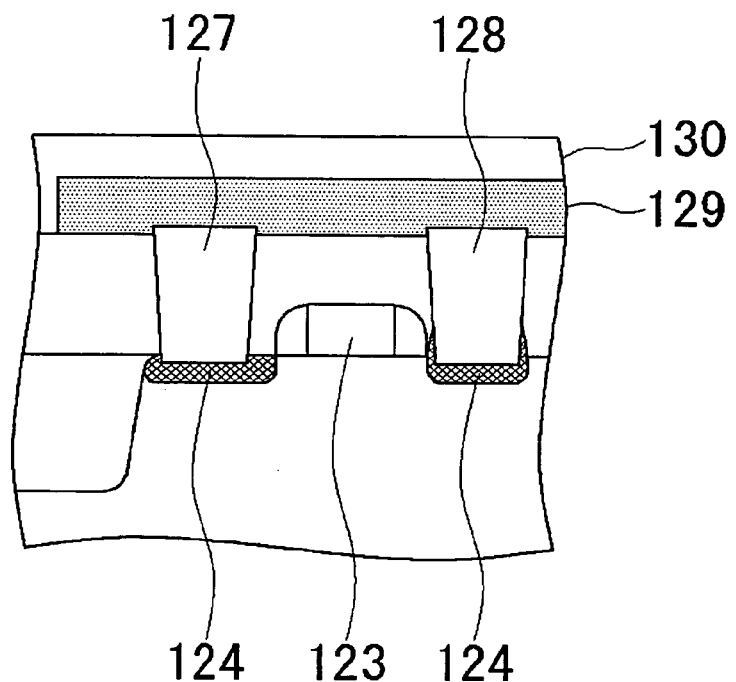
FIG. 4C and FIG. 4D illustrate a process for manufacturing a capacitor according to an embodiment.

Then, on the cell contacts 127, 128 are sequentially formed a bit line 129 and an interlayer insulating film 130. The upper surface of the interlayer insulating film 130 is leveled by CMP (chemical mechanical polishing) (FIG. 4C).

Figure 4D:
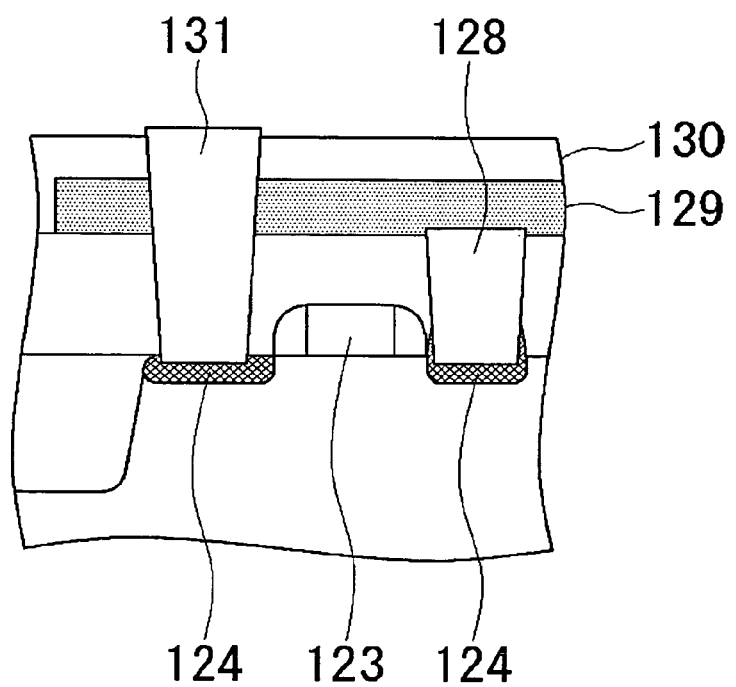

Next, the interlayer insulating film 130 is dry-etched to form a contact hole reaching the cell contact 127. A tungsten film was deposited to fill the contact hole and CMP was conducted to form a capacitor contact 131 (FIG. 4D). Although the bit line 129 and the capacitor contact 131 are drawn in the same cross-sectional view in FIG. 4D, it is for the sake of deeper understanding of the whole structure, but actually these are not crossed.

Figure 5E:
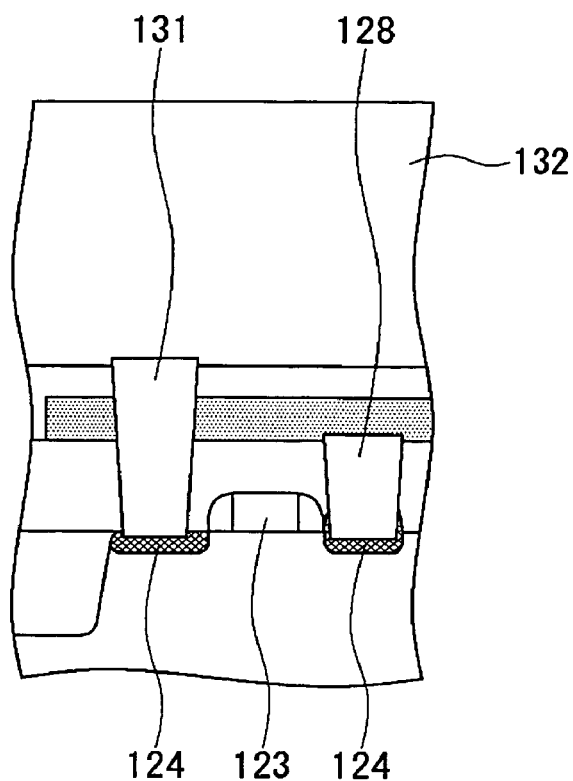
FIG. 5E and FIG. 5F illustrate a process for manufacturing a capacitor according to an embodiment.
Figure 5F:
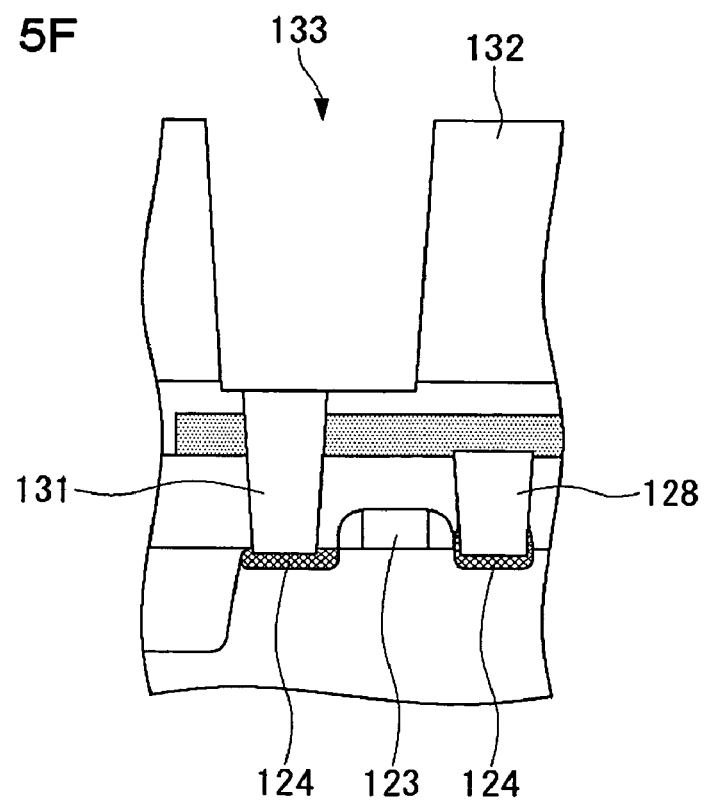

Then, as shown in FIG. 5E, on the capacitor contact 131 is formed an interlayer insulating film 132. Then, as shown in FIG. 5F, in the interlayer insulating film 132 is opened a cylinder 133 for forming a capacitor. The cylinder 133 may have, for example, an elliptical cylindrical shape with a depth of 300 to 500 nm, a longer axis of 0.3 to 0.5 μm and a shorter axis of 0.15 to 0.3 μm.

Figure 6G:
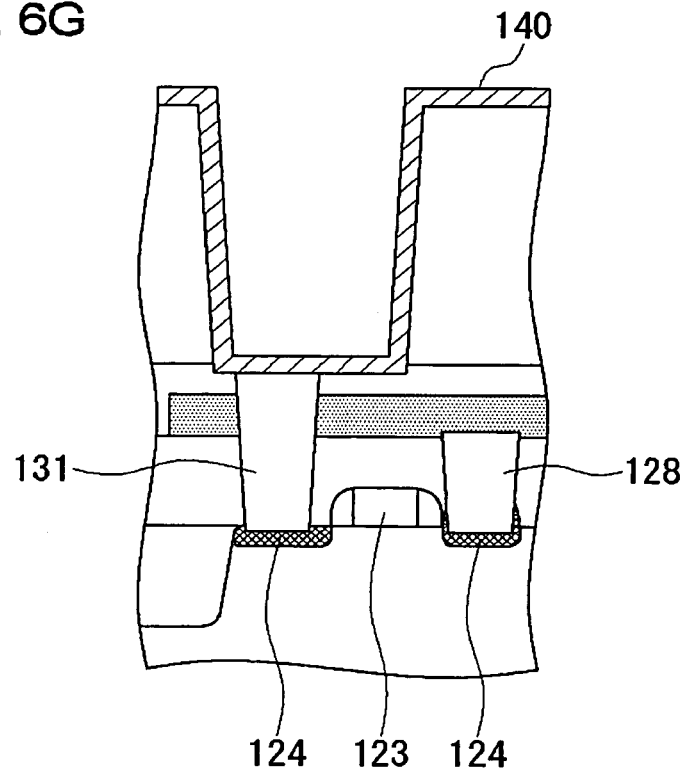
FIG. 6G and FIG. 6H illustrate a process for manufacturing a capacitor according to an embodiment.

Then, as shown in FIG. 6G, a lower electrode 140 is formed by CVD to a film thickness of 5 to 40 nm.

Figure 6H:
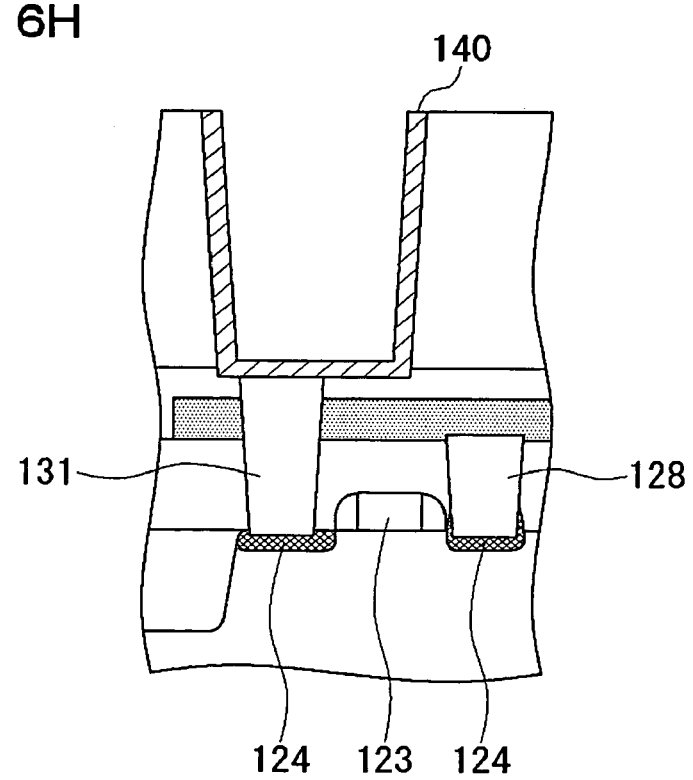

The inside of the cylinder 133 is filled with a photoresist, the whole surface of the substrate is etched back, and then the photoresist in the inside of the cylinder 133 is removed by oxygen plasma processing and organic stripping. Thus, the lower electrode 140 on the outside of the cylinder 133 is removed (FIG. 6H).

Then, over the whole surface of the substrate are sequentially deposited a dielectric film 142 and an upper electrode 144. Herein, the dielectric film 142 is formed by atomic layer deposition (ALD).

The dielectric film 142 has a composition represented by $ZrO_xC_yN_z$ wherein x, y and z meet the following conditions: $0<x$, $0.1 \leq y \leq 1.25$, $0.01 \leq z$, $x+y+z=2$.

Among deposition gas components used in deposition of the dielectric film 142, a metal source gas is a metal compound represented by the general formula $Zr(NRR')_4$ wherein R and R' independently represent hydrocarbon, preferably straight or branched alkyl. As R or R', preferred is alkyl having up to 6 carbon atoms; for example, methyl, ethyl, propyl and tert-butyl.

Preferable examples of the above source gas include $Zr(N(C_2H_5)_2)_4$, $Zr(N(CH_3)_2)_4$ and $Zr(N(CH_3)(C_2H_5))_4$. Such a compound may be selected to obtain a film with a flat surface and to prevent particles from contaminating the film, resulting in a dielectric film with a reduced leak current and good film properties.

An oxidizer gas used in deposition of the dielectric film may be oxygen or an oxygen-containing compound such as NO, $NO_2$, $N_2O$, $H_2O$, $O_2$ and $O_3$. Among these, NO, $NO_2$ and $N_2O$ are preferable, and a combination of a nitriding and an oxidizing gases such as a mixture of NO and $NO_2$ or NO and $O_3$ is more preferable. Such a gas may be selected to consistently obtain a dielectric film with good film properties. While $H_2O$ tends to remain in a deposition system in a process employing $H_2O$ as an oxidizing agent frequently used in the prior art, NO, $N_2O$ or $NO_2$ may be easily removed from a deposition system by purging, resulting in an improved production efficiency.

For example, a $ZrO_2$ film was deposited to 10 nm by one of the following methods. A required deposition time was 20 min and 18 min in Methods 1 and 2, respectively, while being 55 min in Method 3.

Method 1
  Deposition gas: $Zr(N(CH_3)(C_2H_5))_4$+NO
Method 2
  Deposition gas: $Zr(N(CH_3)(C_2H_5))_4$+$O_3$
Method 3
  Deposition gas: $ZrCl_4$+$H_2O$ A deposition temperature for the dielectric film 142 is preferably 200° C. to 400° C. both inclusive. At a temperature lower than 200° C., impurities in the $ZrO_2$ film may increase. At a temperature higher than 400° C., decomposition of $Zr(NRR')_4$ may be initiated on a substrate on which deposition occurs to cause contamination with impurities to an unacceptable level. At an excessively higher deposition temperature, a crystal grain size may be increased, leading to an increased leak current.

A ratio of a metal-containing deposition gas to an oxidizing gas (a metal-containing deposition gas/an oxidizing gas) is preferably 1/100 or less for reducing impurities in the film.

When using a mixture of NO and $N_2$ as an oxidizing gas, a ratio of $NO/N_2$ is preferably 1/10,000 or more.

A pressure during deposition is, for example, 10 mtorr to 10 torr.

Figure 8A:
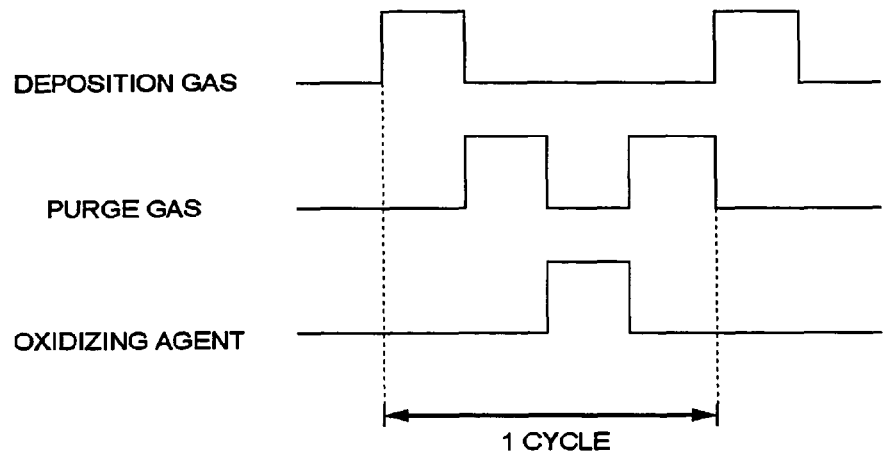
FIG. 8A and FIG. 8B show exemplary sequences for depositing an oxide film and an oxynitride film, respectively.
Figure 8B:
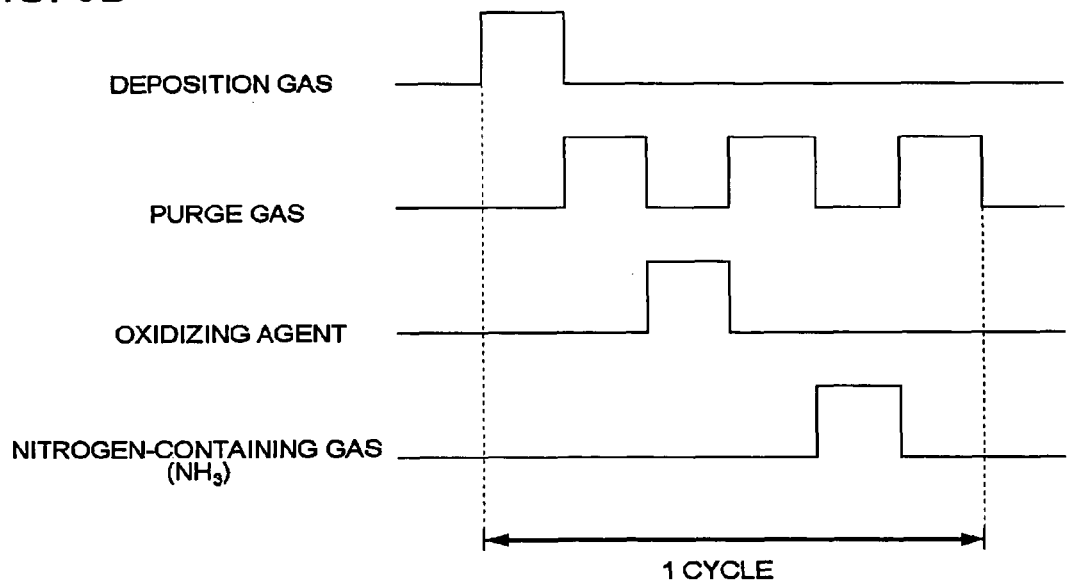

A deposition gas may be fed, for example, as shown in FIG. 8A and FIG. 8B. FIG. 8A and FIG. 8B show exemplary sequences for depositing an oxide film and an oxynitride film, respectively. In FIG. 8B, ammonia is introduced during deposition to form an oxynitride film. In the figure, a "deposition gas" indicates a metal-compound source gas and an "oxidizing agent" indicates oxygen or an oxygen-containing compound gas. There will be described the sequence in FIG. 8A for the case where a deposition gas, an oxidizer gas and a purge gas are $Zr(N(CH_3)(C_2H_5))_4$, NO and an inert gas, respectively.

First, by feeding $Zr(N(CH_3)(C_2H_5))_4$ as a source material into a chamber in an ALD apparatus, a reaction is initiated in the lower electrode surface to grow only one atomic layer. After stopping feeding of $Zr(N(CH_3)(C_2H_5))_4$, an inert gas, typically Ar or $N_2$ is fed as a purge gas into the chamber to remove excessive unreacted $Zr(N(CH_3)(C_2H_5))_4$.

Then, NO is fed to remove a functional group having a Zr terminus which has grown on the substrate. After stopping feeding of NO, an inert gas, typically Ar or $N_2$ is fed as a purge gas to remove unreacted NO and reaction byproducts. Then, the purge gas is stopped.

The sequential cycle of $Zr(N(CH_3)(C_2H_5))_4$ feeding, purging, NO feeding and purging can be repeated a desired number of times to give a dielectric film 142 made of $ZrO_xC_yN_z$ wherein x, y and z meet the conditions: $0<x$, $0.1 \leq y \leq 1.25$, $0.01 \leq z$, $x+y+z=2$, having a thickness of 5 to 15 nm.

In addition to appropriately selecting a deposition gas, it is also important to select the optimum deposition conditions depending on the deposition gas for allowing x, y and z in $ZrO_xC_yN_z$ to meet the conditions: $0<x$, $0.1 \leq y \leq 1.25$, $0.01 \leq z$ and $x+y+z=2$. The deposition gas is preferably the above metal compound represented by $Zr(NRR')_4$ wherein R and R' independently represent straight or branched alkyl. In terms of the deposition conditions, a deposition temperature, a deposition pressure, a deposition rate and a deposition gas are selected as appropriate.

Figure 7I:
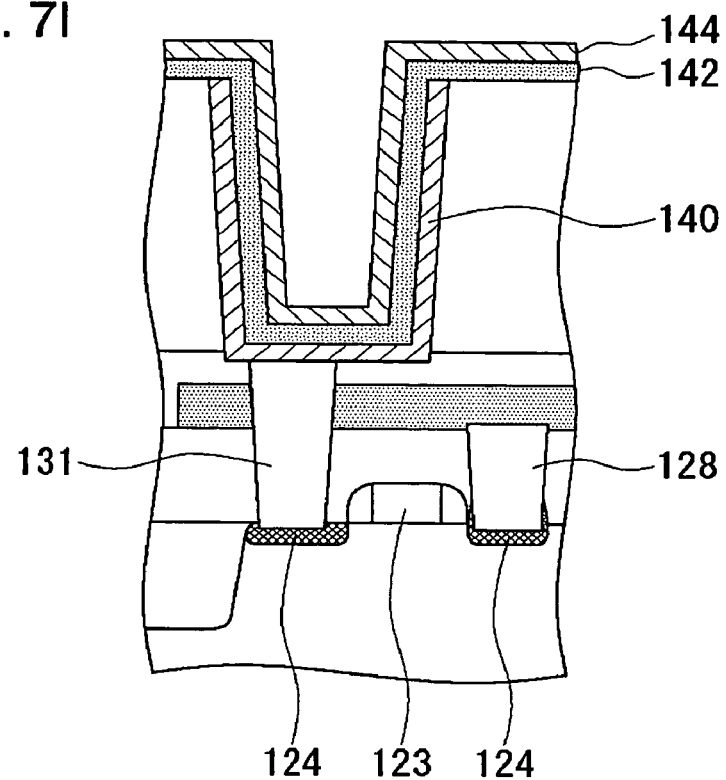
FIG. 7I and FIG. 7J illustrate a process for manufacturing a capacitor according to an embodiment.

After forming the dielectric film 142, an upper electrode 144 is formed by CVD to a thickness of 5 to 40 nm. Now, the state shown in FIG. 7I is obtained.

Figure 7J:
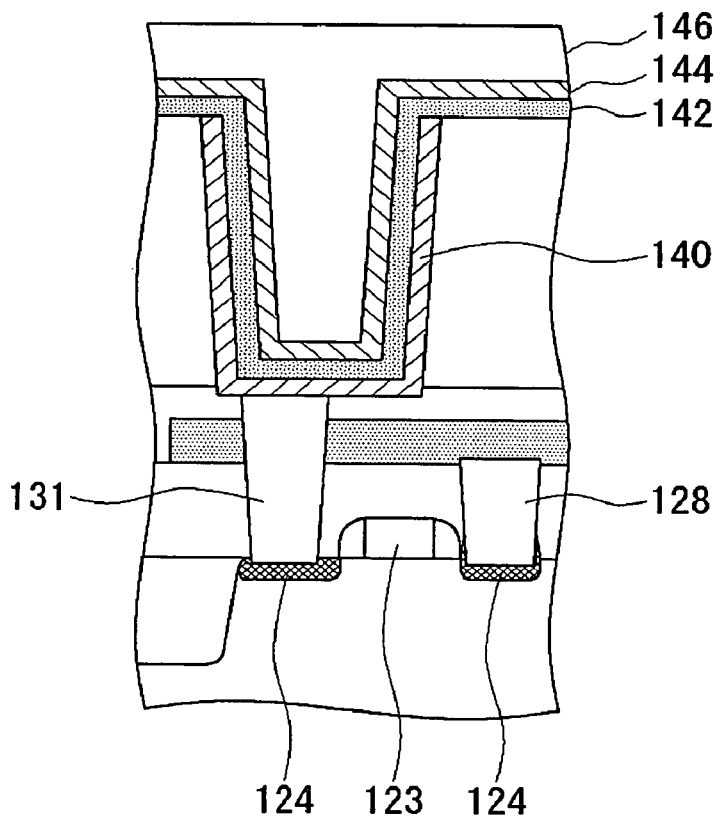

Then, as shown in FIG. 7J, a tungsten film 146 is formed such that the inside of the cylinder 133 is filled. On the tungsten film is formed a resist film having a given opening, which is then used as a mask for selective dry etching of the tungsten film 146 to separate devices. Thus, an MIM type capacitor as shown in FIG. 1 is provided.

The MIM type capacitor thus formed is a high capacity device because it comprises a dielectric film made of ZrOCN which is a highly insulating material with a higher dielectric constant. Furthermore, since interfaces between the lower electrode and the dielectric film and between the dielectric film and the upper electrode can be stably kept in a good state, reduction in a capacitance value and increase in dielectric film leak can be effectively prevented.

There has been described an example of a cylinder type capacitor, but this invention is not limited to it. Thus, this invention may be applied to a planar or box type capacitor.

Embodiment 2

In Embodiment 1, after forming the dielectric film 142, the dielectric film 142 may be nitrided by a plasma using a nitrogen-containing compound such as $N_2O$ and $NH_3$, to more effectively reduce a leak current in a capacitor.

Figure 9:
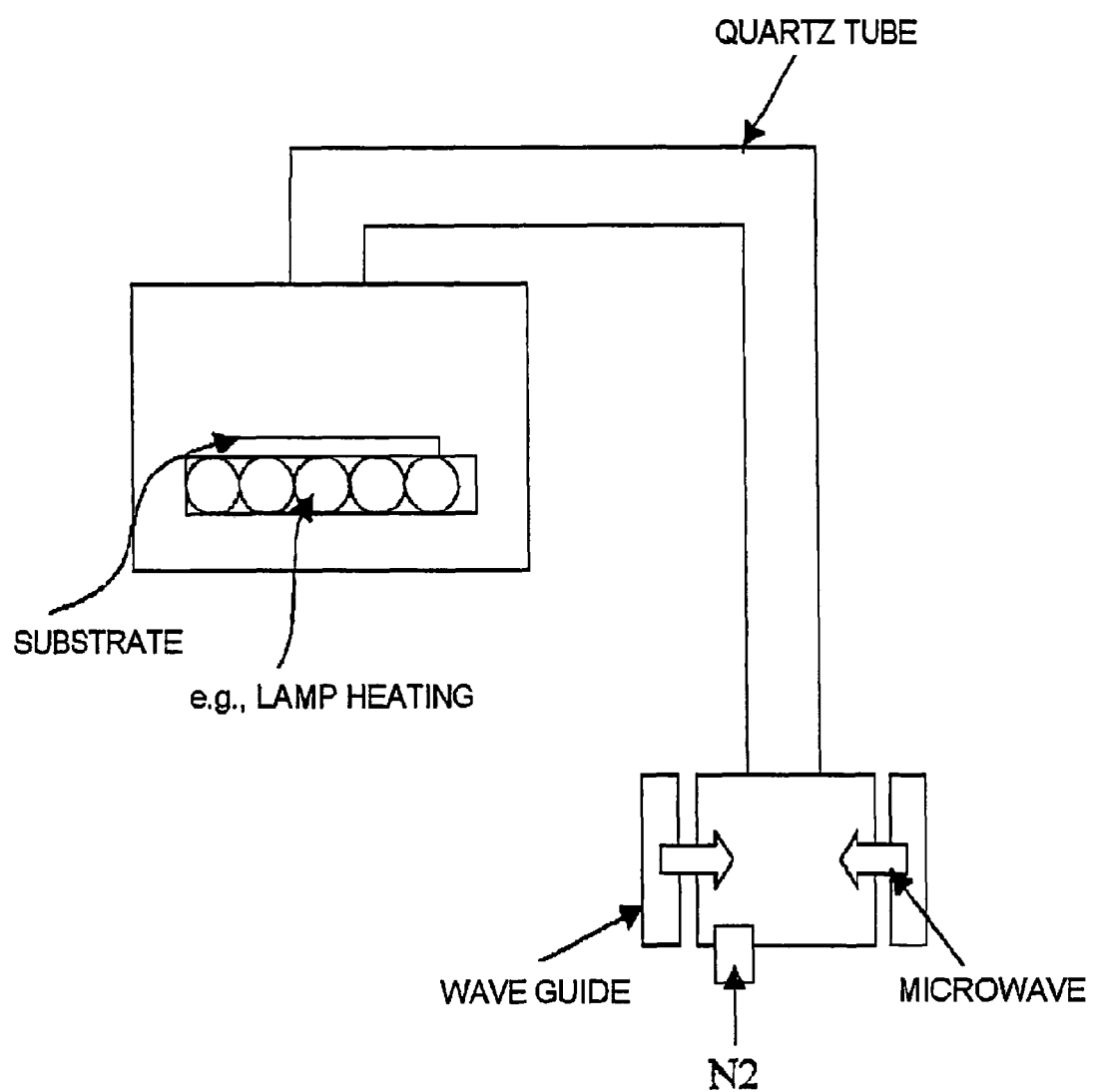
FIG. 9 is a conceptual diagram of a remote plasma.

In such a nitriding process, it is preferable to use a remote plasma. FIG. 9 is a conceptual diagram of a remote plasma. A plasma is generated in a plasma generation chamber equipped with a gas inlet, a wave guide and microwave application means, which is placed separately from a deposition chamber where a substrate is disposed. The plasma generated is introduced via a quartz tube into the chamber in which the substrate is disposed. In the chamber, the surface of the substrate is subjected to plasma processing. In FIG. 9, nitrogen alone is introduced for generating a plasma. Such a procedure may be employed to adequately conduct nitriding while preventing the substrate from being damaged. The following plasma conditions may be selected.

Temperature: 400 to 450° C.;
Plasma power: 400 W to 5,000 W;
Flow rate of $N_2$ or $NH_3$: 0.5 L to 5 L/min;
Pressure: 1 mtorr to 10 torr.

Embodiment 3

This embodiment is an example where this invention is applied to a decoupling capacitor. A decoupling capacitor is a high dielectric constant film capacitor formed over an interconnect in an LSI for compensating a voltage reduction induced by a parasitic inductance between a power source and the LSI interconnect. In this embodiment, a dielectric film in the capacitor is formed by ALD whereby the dielectric film can be deposited at a lower temperature and which can eliminate the need for post-annealing under an oxidizing atmosphere, allowing the MIM type film capacitor to act as a decoupling capacitor between power sources.

Figure 10:
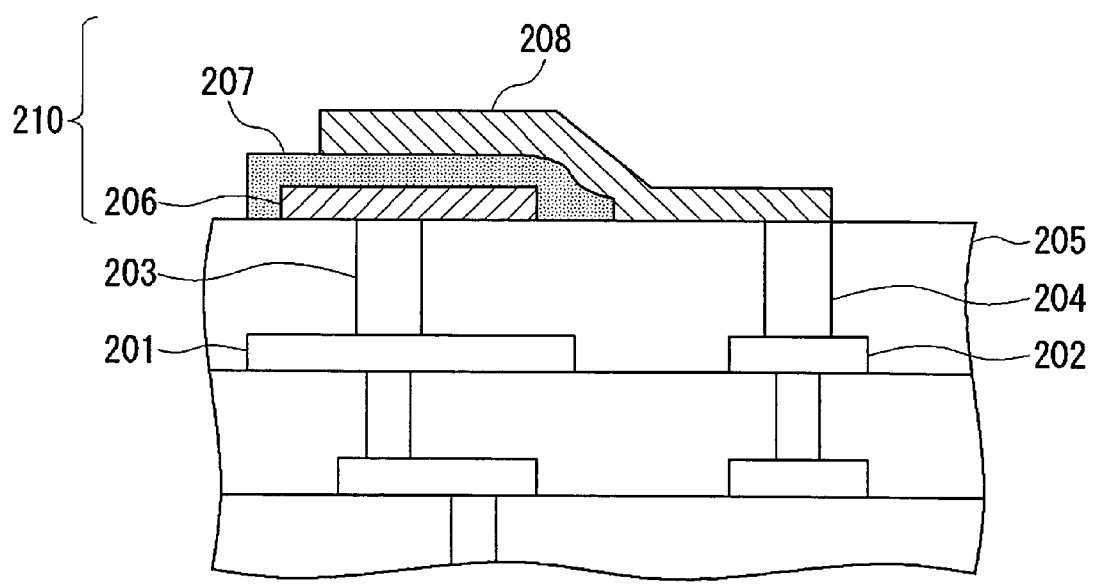
FIG. 10 shows a structure of a decoupling capacitor according to an embodiment.

FIG. 10 is a partial cross-sectional view of a semiconductor device according to this embodiment. On an uppermost interconnect (grounding wire) 201 and an uppermost interconnect (power wire) 202 is formed an interlayer film 205, on which are sequentially formed a lower electrode 206, a dielectric film 207 and an upper electrode 208, to provide a decoupling capacitor 210. The lower electrode 206 and the uppermost interconnect (grounding wire) 201 are connected via a contact plug 203, while the upper electrode 208 and the uppermost interconnect (power wire) 202 are connected via a contact 204.

There will be described a process for manufacturing a decoupling capacitor shown in FIG. 10. First, an interlayer film 205 is deposited on uppermost interconnects 201, 202 in a logic device prepared according to a well-known manufacturing process. In the interlayer film 205 is formed a contact hole, which is then filled by depositing one or two or more of the materials selected from the group consisting of Cu, Al, TiN and W. Then, CMP is conducted to form contact plugs 203, 204. After CMP, on the interlayer film 205 and the contact plugs 203, 204 is deposited a lower electrode film made of at least one material selected from the group consisting of TiN, Ti, TaN, Ta, W, WN, Pt, Ir and Ru by reactive sputtering or ALD. The lower electrode film is shaped into a predetermined shape to form a lower electrode 206.

After forming the lower electrode 206, a dielectric film is formed by ALD at a deposition temperature of 200 to 400° C. The dielectric film has a composition represented by $ZrO_xC_yN_z$ wherein x, y and z meet the conditions: $0<x$, $0.1 \leq y \leq 1.25$, $0.01 \leq z$ and $x+y+z=2$. A film thickness is about 2 to 15 nm. The procedure for depositing the film and a deposition and an oxidizer gases used are as described in Embodiment 1. Since a metal-compound film having such a particular composition is used as a dielectric film, this embodiment can provide a capacitor with a higher capacity and a reduced leak current.

After shaping the dielectric film into a desired shape to obtain a dielectric film 207, on which is deposited an upper electrode film made of at least one material selected from the group consisting of TiN, Ti, TaN, Ta, W, WN, Pt, Ir and Ru by sputtering or ALD. It is then shaped into a desired shape to form an upper electrode 208 to give a film capacitor within the semiconductor device, which acts as a decoupling capacitor.

Although the lower electrode is connected to the uppermost interconnect (grounding wire) while the upper electrode is connected to the uppermost interconnect (power wire) in FIG. 10, this invention is not limited to the configuration. A configuration with a different connection style where the lower electrode is connected to the uppermost interconnect (power wire) while the upper electrode is connected to the uppermost interconnect (grounding wire), may be, of course, similarly effective.

Although the film capacitor acting as a decoupling capacitor is formed right above the uppermost interconnect in the device in FIG. 10, the capacitor is not necessarily to be above the uppermost interconnect, but may be formed in any of the inside and the lower part of the device.

As described above, according to Embodiment 3, a dielectric film having a high dielectric constant can be formed by ALD allowing deposition at a lower temperature and eliminating the need for post-annealing under an oxidizing atmosphere, to form a film capacitor within a semiconductor device without property deterioration or yield reduction due to oxidation of an interconnect layer.

The film capacitor may be used as a decoupling capacitor to solve the problems in a conventional on-chip decoupling capacitor while achieving advantages in an on-chip decoupling capacitor, i.e., a low inductance and a high capacity.

A film capacitor comprising a dielectric film having the above particular composition can be formed on the uppermost interconnect in a semiconductor device to achieve an on-chip decoupling capacitor with a lower inductance and a higher capacity, which can adequately deal with speeding-up in an LSI.

Embodiment 4

In this embodiment, this invention is applied to an MOSFET. An MOSFET according to this embodiment has a structure shown in FIG. 11. A transistor in FIG. 11 comprises a gate electrode consisting of a gate insulating film consisting of a laminate of a silicon oxynitride film 402 and a metal-compound film 404 on a silicon substrate 400 and a gate electrode 406 made of polysilicon. On the lateral face of the gate electrode is formed a side wall 410 comprised of a silicon oxide film. On the surface of the silicon substrate 400 adjacent to both sides of the gate electrode is formed a source-drain region 412 in which a dopant is dispersed.

The metal-compound film 404 has a composition represented by $HfO_xC_yN_z$ wherein x, y and z meet the conditions: $0<x$, $0.1 \leq y \leq 1.25$, $0.01 \leq z$ and $x+y+z=2$. Such a film can be used to effectively prevent a dopant in the gate electrode from penetrating into the silicon substrate.

Preferable examples of a source gas for depositing the above metal-compound film include $Hf(N(C_2H_5)_2)_4$, $Hf(N(CH_3)_2)_4$ and $Hf(N(CH_3)(C_2H_5))_4$. Such a compound can be selected to more effectively prevent a dopant in the gate electrode from penetrating into the silicon substrate.

Figure 11:
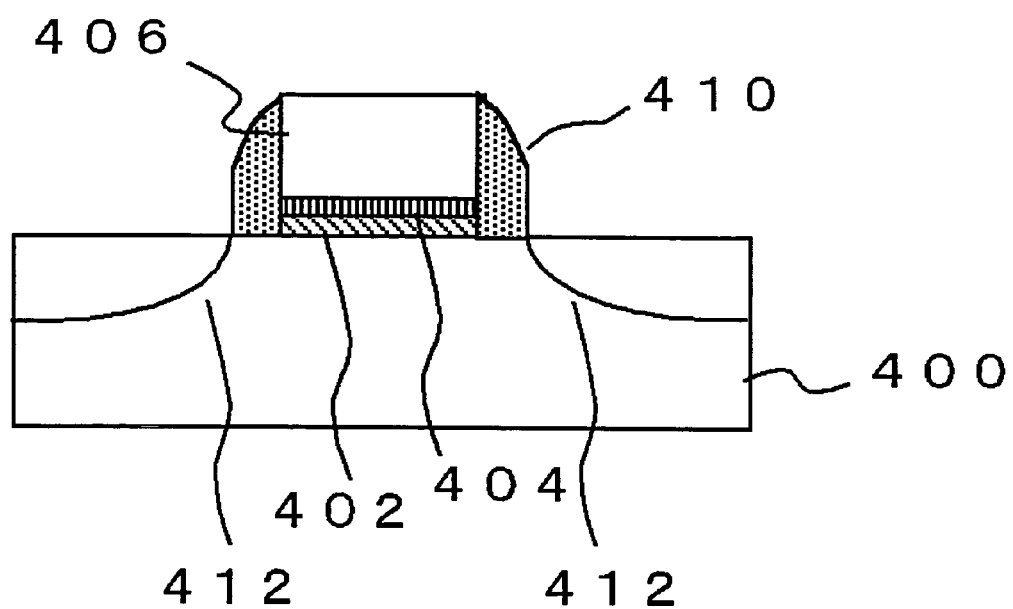
FIG. 11 shows a structure of a transistor according to an embodiment.
Figure 12A:
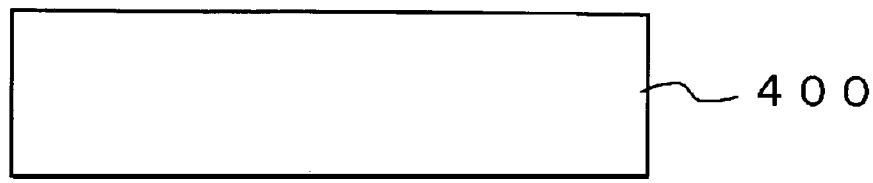
FIG. 12A, FIG. 12B, FIG. 12C and FIG. 12D illustrate a process for manufacturing a transistor according to an embodiment.
Figure 12B:
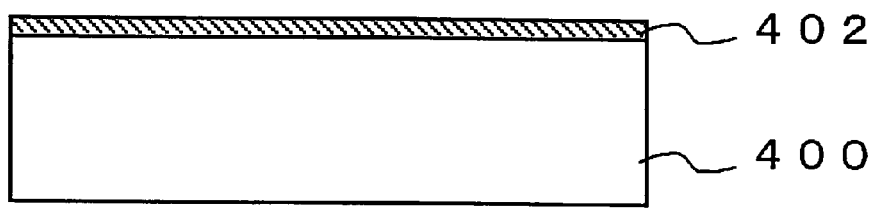
Figure 12C:
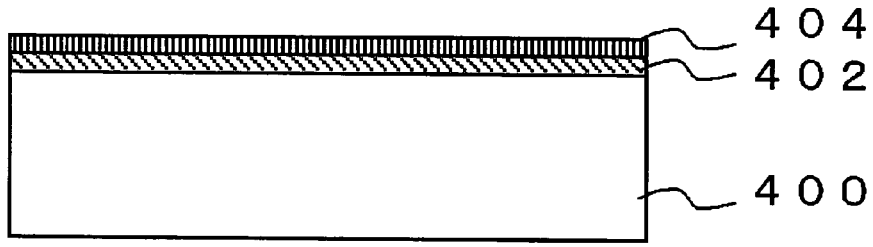

There will be described a process for manufacturing a transistor shown in FIG. 11 with reference to FIG. 12A, FIG. 12B, FIG. 12C, FIG. 12D, FIG. 13E and FIG. 13F. First, a silicon substrate 400 whose surface has been washed with a given chemical is prepared as shown in FIG. 12A. Then, as shown in FIG. 12B, a silicon oxynitride film 402 is deposited by CVD on the main surface of the silicon substrate 400. Then, as shown in FIG. 12C, a metal-compound film 404 is formed by atomic layer deposition. A metal source gas in a deposition gas used in the deposition is a metal compound represented by the general formula:

$$Hf(NRR')_4$$

wherein R and R' independently represent hydrocarbon, preferably straight or branched alkyl. R and R' are preferably alkyl having up to 6 carbon atoms; for example, methyl, ethyl, propyl and tert-butyl.

An oxidizer gas used in deposition of the metal-compound film 404 may be oxygen or an oxygen-containing compound such as NO, $NO_2$, $N_2O$, $H_2O$, $O_2$ and $O_3$. Among these, NO, $NO_2$ and $N_2O$ are preferable, and a combination of a nitriding and an oxidizing gases such as a mixture of NO and $NO_2$ or NO and $O_3$ is more preferable. Such a gas may be selected to consistently obtain a dielectric film with good film properties. NO, $N_2O$ or $NO_2$ may be easily removed from a deposition system by purging, resulting in an improved production efficiency.

A deposition gas may be fed as described below. First, by feeding $Hf(N(CH_3)(C_2H_5))_4$ as a source material into a chamber in an ALD apparatus, a reaction is initiated in the lower electrode surface to grow only one atomic layer. After stopping feeding of $Hf(N(CH_3)(C_2H_5))_4$, an inert gas, typically Ar or $N_2$ is fed as a purge gas into the chamber to remove excessive unreacted $Hf(N(CH_3)(C_2H_5))_4$.

Then, NO is fed to remove a functional group having a Hf terminus which has grown on the substrate. After stopping feeding of NO, an inert gas, typically Ar or $N_2$ is fed as a purge gas to remove unreacted NO and reaction byproducts. Then, the purge gas is stopped.

The sequential cycle of $Hf(N(CH_3)(C_2H_5))_4$ feeding, purging, NO feeding and purging is repeated a desired number of times to give a metal-compound film 404 made of $HfO_xC_yN_z$ wherein x, y and z meet the conditions: $0<x$, $0.1 \leq y \leq 1.25$, $0.01 \leq z$, $x+y+z=2$, having a thickness of 5 to 15 nm.

Figure 12D:
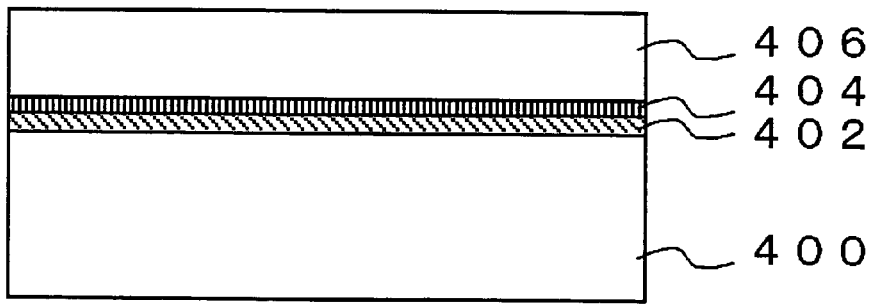

Then, as shown in FIG. 12D, on the metal-compound film 404 is formed a gate electrode film 406. The gate electrode film 406 may be preferably made of polycrystal, but may be another type of metal electrode such as SiGe, TiN, WN and Ni.

Figure 13E:
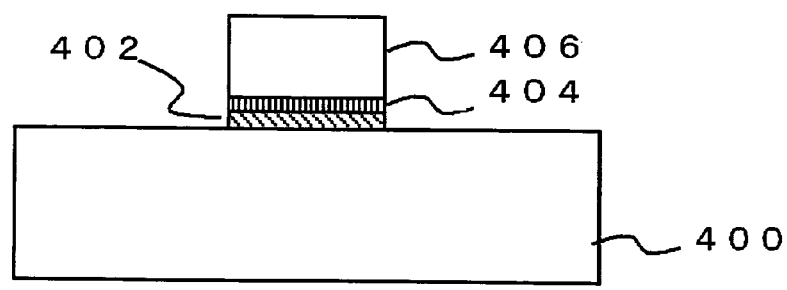
FIG. 13E and FIG. 13F illustrate a process for manufacturing a transistor according to an embodiment.
Figure 13F:
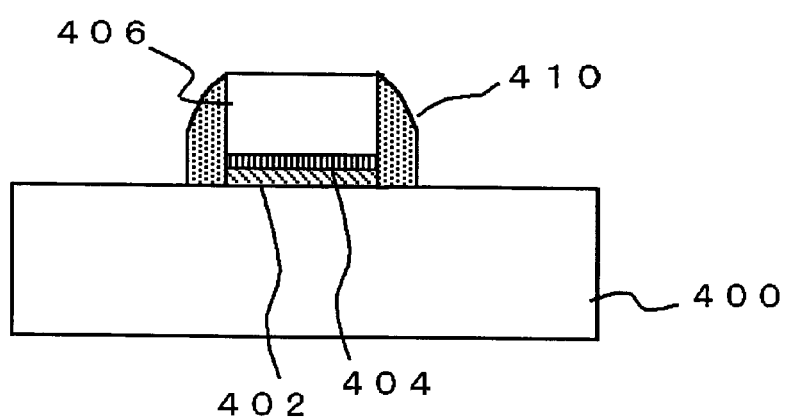

Next, as shown in FIG. 13E, the silicon nitride film 402, the metal-compound film 404 and the gate electrode film 406 are etched into given shapes to obtain a gate electrode. Then, while forming a side wall 410 on the lateral face of the gate electrode, a dopant is introduced into the gate electrode and the surface of the silicon substrate 400 adjacent to both sides of the gate electrode. Thus, an MOSFET shown in FIG. 13F is prepared.

In the MOSFET according to this embodiment, since the gate insulating film comprises a metal-compound film 404 having the above particular composition, it can effectively prevent a dopant in the gate electrode film 406 from penetrating the gate insulating film into the silicon substrate 400. Thus, a highly reliable transistor can be obtained.

Although there have been described preferred embodiments of this invention, it will be apparent to those skilled in the art that these embodiments are only illustrative and that there may be many variations, which can be encompassed within this invention.

For example, a Zr-containing and an Hf-containing films are used for a capacitor and a transistor, respectively, in the above embodiments. An Hf-containing and a Zr-containing films may be, on the contrary, used for a capacitor and a transistor, respectively. A film containing both Hf and Zr may be used as a capacitive and/or a gate insulating films.

A capacitive or gate insulating film may be single-layered or multi-layered. When being multi-layered, it may comprise a plurality of metal-compound films having the above particular composition. In a multilayered structure, the individual layers may have different compositions, for example, as in a laminate film of ZrOCN and HfOCN as long as they have a composition within the above particular range.

In a capacitive or gate insulating film, a part in contact with an electrode may be made of a material other than that in the above metal-compound film. For example, in an interface between a gate insulating film and a silicon substrate or an interface between a gate insulating film and a gate electrode, a metal nitride or metal oxynitride film may be formed for preventing a reaction of silicon with the metal-compound film.

EXAMPLES

On a silicon substrate was formed a transistor. In the upper part of the transistor was formed a cylindrical type capacitor having the structure in FIG. 1 as described in Embodiment 1 such that the capacitor was connected with a diffusion layer in the transistor. The capacitor had a structure where a lower electrode made of TiN with a thickness of 30 nm, a dielectric film with a thickness of 10 nm and an upper electrode made of TiN with a thickness of 30 nm were sequentially deposited.

The dielectric film was deposited by atomic layer deposition. Varying the deposition conditions as shown in Table 1, samples Nos. 1 to 8 were prepared. Elemental compositions for the dielectric films thus prepared were determined by SIMS (secondary ion mass spectrometry) The results were shown in Table 2.

Sample Nos. 2 to 4 had a composition represented by $ZrO_xC_yN_z$, in which x, y and z met the conditions: $0.7<x$, $0.1 \leq y \leq 1.25$, $0.01 \leq z$, and $x+y+z=2$.

On the other hand, sample Nos. 6 to 8 had a composition deviating from the range for x, y and z defined in the above formula. It may be found that although in all of sample Nos. 6 to 8 and Nos. 2 to 4, $Zr(N(CH_3)(C_2H_5))_4$ (tetrakis-methylethylamino-zirconium) is used, a composition in a film obtained may vary depending on the deposition conditions. It demonstrates that a metal-compound film having a composition represented by $ZrO_xC_yN_z$ meeting the above conditions cannot be obtained simply by selecting a deposition gas as appropriate, but can be obtained only by appropriately selecting a deposition gas and optimizing the deposition conditions. The deposition conditions may include a deposition temperature, a deposition pressure, a deposition rate and a feeding time of a deposition gas. A combination of these conditions may be optimized to obtain the above metal-compound film.

Films prepared under the same conditions as those for sample Nos. 1 to 5 were analyzed by a particle checker. In sample No. 1, contamination with particles was observed in the film. In sample Nos. 2 to 5 and 6 to 8, contamination with particles was not observed.

Figure 14:
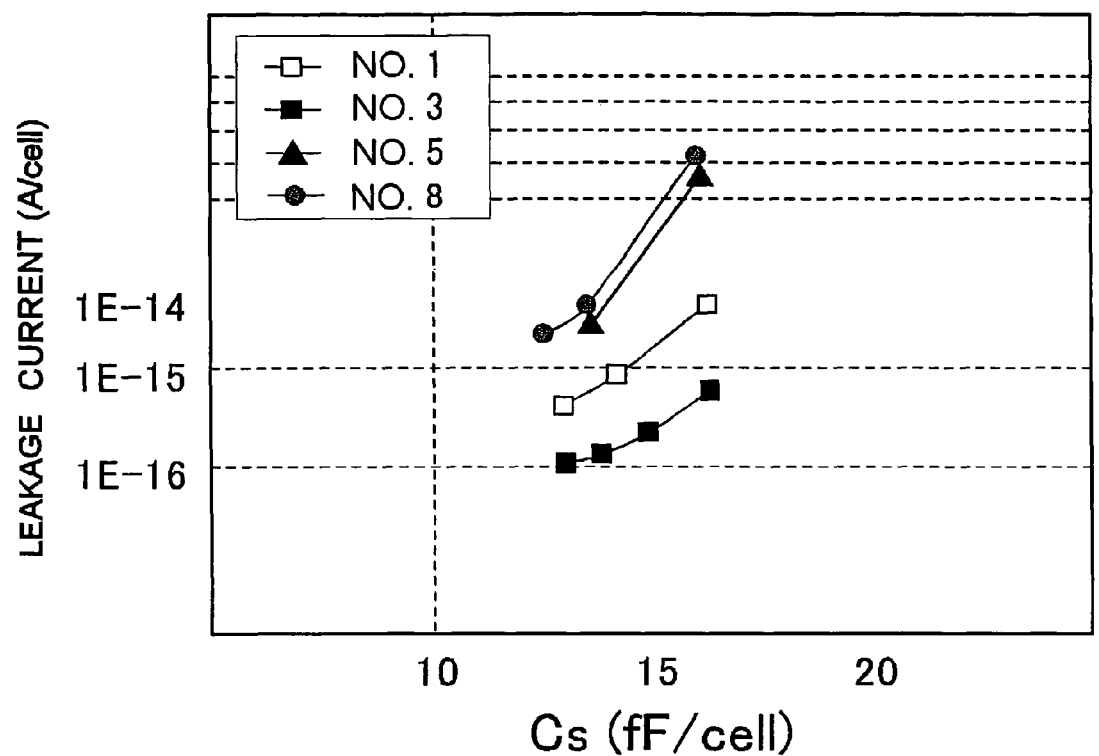
FIG. 14 shows properties of the capacitors evaluated in Examples.

Next, among the samples, sample Nos. 1, 3, 5 and 8 were determined for a capacity and a leak current for comparison. The results are shown in FIG. 14. In this figure, a plurality of measurement results are shown for each sample because measurement was conducted in multiple runs, varying a film thickness deposited. The results indicate that sample No. 3 has a smaller leak current than any other samples. Similar measurement was conducted for sample Nos. 2 and 4, giving the results that they have a smaller leak current than sample No. 1, 5 or 8.

TABLE 1

|  |  | NO. 1 | NO. 2 | NO. 3 | NO. 4 | NO. 5 | NO. 6 | NO. 7 | NO. 8 |
|---|---|---|---|---|---|---|---|---|---|
| Gas 1 | | $ZrCl_4$ | $Zr(N(CH_3)(C_2H_5))_4$ | $Zr(N(CH_3)(C_2H_5))_4$ | $Zr(N(CH_3)(C_2H_5))_4$ | $Zr(OiPr)_4$ | $Zr(N(CH_3)(C_2H_5))_4$ | $Zr(N(CH_3)(C_2H_5))_4$ | $Zr(N(CH_3)(C_2H_5))_4$ |
| Gas 2 | | $H_2O$ | NO | NO | NO | $O_2$ | NO | NO | NO |
| Gas 3 | | $N_2$ | $N_2$ | $N_2$ | $N_2$ | $N_2$ | $N_2$ | $N_2$ | $N_2$ |
| Gas flow ratio 1/2/3 | | 1/2.5/10 | 1/100/1000 | 1/100/1000 | 1/100/1000 | — | 1/100/1000 | 1/20/1000 | 100/1/1000 |
| Deposition temperature (° C.) | | 200-400 | 200-400 | 200-400 | 200-400 | 200-400 | 150 | 200-400 | 200-400 |
| Deposition pressure (torr) | | 0.05-10 | 0.05-10 | 0.05-10 | 0.05-10 | 0.05-10 | 0.05-10 | 0.05-10 | 0.05-10 |
| Deposition rate (Å/cycle) | | 0.4-3 | 0.4-3 | 0.4-3 | 0.4-3 | 10-50 | 0.4-3 | 0.4-3 | 0.4-3 |
| Elemental composition | O | 1.974 | 1.842 | 1.15 | 0.71 | 0.5 | 0.415 | 0.559 | 0.38 |
| | C | 0.02 | 0.105 | 0.8 | 1.19 | 1.499 | 1.583 | 1.34 | 1.61 |
| | N | 0.001 | 0.053 | 0.05 | 0.1 | 0.001 | 0.002 | 0.001 | 0.01 |
| | Cl | 0.005 | 0 | 0 | 0 | 0 | 0 | 0 | 0 |

As described above, this invention can provide a highly reliable semiconductor device having a high capacity comprising a film made of a high dielectric constant material containing Zr and/or Hf, in which a leak current is reduced in the film. When applying this invention to a capacitor, a capacitor having a high capacity with a reduced leak current can be provided. Furthermore, when applying this invention to a transistor, a transistor in which a film thickness calculated as a silicon oxide film is smaller and which comprises a reliable gate insulating film can be provided.

What is claimed is:

1. A process for manufacturing a semiconductor device, comprising the steps of:
   forming a $ZrO_xC_yN_z$ (x+y+z=2, 0.7<x) film as a dielectric film on a lower electrode by atomic layer deposition using an oxidizer gas and a gas including $Zr(N(CH_3)(C_2H_5))_4$; and
   forming an upper electrode on said dielectric film;
   wherein when forming said dielectric film, a ratio of said gas including $Zr(N(CH_3)(C_2H_5))_4$ to said oxidizer gas is 1/100 or less.

2. The process for manufacturing a semiconductor device as claimed in claim 1, wherein said oxidizer gas is a mixture of a nitriding gas and an oxidizing gas.

3. The process for manufacturing a semiconductor device as claimed in claim 2, wherein said nitriding gas is NO and said oxidizing gas is $NO_2$.

4. The process for manufacturing a semiconductor device as claimed in claim 2, wherein said nitriding gas is NO and said oxidizing gas is $O_3$.

5. The process for manufacturing a semiconductor device as claimed in claim 1, wherein said oxidizer gas is $O_3$.

6. The process for manufacturing a semiconductor device as claimed in claim 1, wherein said oxidizer gas is NO.

7. The process for manufacturing a semiconductor device as claimed in claim 1, wherein said oxidizer gas is a mixture of NO and $N_2$, a ratio of $NO/N_2$ is 1/10,000 or more.

8. The process for manufacturing a semiconductor device as claimed in claim 1, wherein when forming said dielectric film a nitrogen-containing gas is fed into a chamber.

9. The process for manufacturing a semiconductor device as claimed in claim 8, wherein a cycle of said atomic layer deposition includes a step of feeding said nitrogen-containing gas.

10. The process for manufacturing a semiconductor device as claimed in claim 1, wherein after forming said dielectric film, said dielectric film is nitrided by a plasma.

11. The process for manufacturing a semiconductor device as claimed in claim 1,
    wherein said lower electrode and upper electrode films are formed of metal material.

12. The process for manufacturing a semiconductor device as claimed in claim 11,
    wherein said metal material is TiN.

* * * * *